US012764874B2

(12) United States Patent
Wang

(10) Patent No.: US 12,764,874 B2
(45) Date of Patent: Oct. 13, 2026

(54) WATERPROOF LED CONTROLLER

(71) Applicant: Guangzhou Ting Shen Electric Co., Ltd, Guangzhou (CN)

(72) Inventor: Chia-Chun Wang, Guangzhou (CN)

(73) Assignee: Guangzhou Ting Shen Electric Co., Ltd, Guangzhou (CN)

( * ) Notice: Subject to any disclaimer, the term of this patent is extended or adjusted under 35 U.S.C. 154(b) by 341 days.

(21) Appl. No.: 18/604,533

(22) Filed: Mar. 14, 2024

(65) Prior Publication Data

US 2025/0247967 A1 Jul. 31, 2025

(30) Foreign Application Priority Data

Jan. 31, 2024 (CN) ......................... 202420236610.0

(51) Int. Cl.
*H05K 5/00* (2025.01)
*H01R 13/52* (2006.01)
*H05K 5/06* (2006.01)

(52) U.S. Cl.
CPC ....... *H05K 5/0056* (2013.01); *H01R 13/5202* (2013.01); *H05K 5/0052* (2013.01); *H05K 5/006* (2013.01); *H05K 5/0069* (2013.01); *H05K 5/069* (2013.01)

(58) Field of Classification Search
CPC .... H05K 5/0056; H05K 5/0052; H05K 5/006; H05K 5/0069; H05K 5/069; H01R 13/5202; F21V 23/008; F21V 31/005
See application file for complete search history.

(56) References Cited

U.S. PATENT DOCUMENTS 7,789,696 B2 * 9/2010 Umei ..................... H05K 5/063 439/447

FOREIGN PATENT DOCUMENTS

| | | | | |
|---|---|---|---|---|
| CN | 208290505 U | | 12/2018 | |
| DE | 20114842 U1 | * | 12/2001 | H01R 33/965 |
| TW | 202327194 A | * | 7/2023 | H01R 13/504 |

OTHER PUBLICATIONS

Machine Translation CA 1333188 C, (dated Nov. 22, 1994) (Year: 2026).*
Machine Translation TW 202327194 A, (dated Jul. 1, 2023) (Year: 2026).*

* cited by examiner

*Primary Examiner* — Travis S Chambers

(57) ABSTRACT

A waterproof LED controller, including a housing, a power cord component on one side of the housing, and a connecting socket on the other side of the housing. In addition to forming a certain level of waterproofing through ultrasonic welding between the first housing and the second housing, the locating protrusion on the first housing and the locating groove on the second housing are also ultrasonically welded. Furthermore, a welding groove matching the welding protrusion on the connecting socket is provided on the inner surface of the first mounting hole, allowing the welding protrusion and welding groove to be ultrasonically welded. Additionally, waterproofing at the switch through-hole is achieved by supporting the circuit board with a first support pillar, causing the circuit board to press against rubber buttons. This results in a sealed structure, ultimately achieving the overall waterproofing.

8 Claims, 8 Drawing Sheets

WATERPROOF LED CONTROLLER

CROSS REFERENCE TO RELATED APPLICATIONS

The present application claims the benefit of Chinese Patent Application No. 2024202366100 filed on Jan. 31, 2024, the contents of which are incorporated herein by reference in their entirety.

TECHNICAL FIELD

This patent application relates to the field of LED controllers, specifically to a waterproof LED controller.

BACKGROUND ART

Currently, most LED controllers on the market do not have waterproof designs because controllers generally do not come into contact with water. This leads to the controllers failing upon contact with water, resulting in them being discarded.

The patent application with the authorization announcement number CN208290505U describes an ultrasonic welding structure for a waterproof LED power supply plastic housing, including a top cover, a bottom cover, a PCBA circuit board component, a power cord, and a fixture. The bottom cover is installed inside the fixture, with both the PCBA circuit board component and the power cord installed inside the bottom cover. The top cover is placed on top of the bottom cover. The top of the peripheral wall of the bottom cover has a first welding step and a second welding step, and the inner side wall of the bottom cover has a first guiding straight edge and a second guiding straight edge, corresponding to the first and second welding steps, respectively. The bottom of the top cover has a first welding rib and a second welding rib, matching the first and second welding steps, respectively. An overflow slot is formed at the bottom part of the top cover located between the first and second welding ribs, and the top cover is ultrasonically welded to the bottom cover. However, this patent application still cannot achieve the overall waterproofing.

SUMMARY

The problem to be solved by this patent application is to provide a waterproof LED controller with good sealing, capable of achieving overall waterproofing.

To solve the above technical problems, the technical solution adopted by this patent application is a waterproof LED controller, including a housing, a power cord component on one side of the housing, and a connecting socket on the other side of the housing. The housing includes a first housing and a second housing fixedly connected to the first housing. The inner surface of the first housing has locating protrusions, and the inner surface of the second housing has locating grooves matching the protrusions. The locating protrusions and grooves are connected by ultrasonic welding to fix the first and second housings together. The housing has a first mounting through-hole on one side for the connecting socket and a second mounting through-hole on the other side for the power cord component. The inner surfaces of both the first and second mounting through-holes have convex strips. The connecting socket has a matching part that forms a tight fixed connection with the first mounting through-hole after ultrasonic welding of the housing. The power cord component includes a power cord and a strain relief, with the strain relief having a matching part that forms a tight fixed connection with the second mounting through-hole after ultrasonic welding of the housing. The first mounting through-hole has a welding groove, and the connector seat has a welding protrusion matching the welding groove, which are fixedly connected by ultrasonic welding.

As an improvement, both sides of the first housing and the second housing have a first groove and a second groove. The first groove on the first housing and the first groove on the second housing combine to form the first mounting through-hole. The second groove on the first housing and the second groove on the second housing combine to form the second mounting through-hole.

As an improvement, the inner surface of the second housing has an annular groove with a switching through-hole in the middle, and a rubber button is placed on the annular groove.

As an improvement, the rubber button includes a cylindrical button working part in the middle and a button mounting part around the perimeter. The cylindrical button passes through the switching through-hole, and the button mounting part is an annular protrusion embedded in the annular groove.

As an improvement, the inner surface of the first housing has a first connecting socket slot and a first stain relief slot, and the inner surface of the second housing has a second connecting socket slot and a second stain relief slot.

As an improvement, two first connecting socket pillars are provided on the inner surface of the first housing, forming a first connecting socket latching slot. Two second connecting socket pillars are provided on the inner surface of the second housing, forming a second connecting socket latching slot. Two first strain relief pillars are provided on the inner surface of the first housing, forming a first strain relief latching slot. Two second strain relief pillars are provided on the inner surface of the second housing, forming a second strain relief latching slot.

As an improvement, a connecting socket latching part is provided on the connecting socket, which is inserted into both the first and second connecting socket latching slots. A strain relief latching part is provided on the strain relief, which is inserted into both the first and second strain relief latching slots.

As an improvement, a first support pillar for supporting the circuit board is provided on the inner surface of the first housing, and a second support pillar for supporting the circuit board is provided inside the second housing. The height of the second support pillar is lower than the height after the rubber button mounting part is embedded in the annular groove.

As an improvement, stop pins that restrict the lateral movement of the circuit board is provided inside the second housing.

The beneficial effect of this patent application is that, in addition to a certain level of waterproofness after the first and second housings are ultrasonically welded, waterproofness at the tight junction of the connecting socket and the first mounting through-hole is enhanced by a first convex strip on the first mounting through-hole, and waterproofness at the tight junction of the strain relief and the second mounting through-hole is enhanced by a second convex strip on the second mounting through-hole. The locating protrusion on the first housing and the locating groove on the second housing are ultrasonically welded. A welding groove matching the welding protrusion on the connecting socket is set on the inner surface of the first mounting through-hole, allowing the welding protrusion and welding groove to be ultrasonically welded. the circuit board is supported against the rubber button by the first support pillar, preventing water infiltration through the switching through-hole and forming a sealed structure to achieve overall waterproofing.

Figure 1:
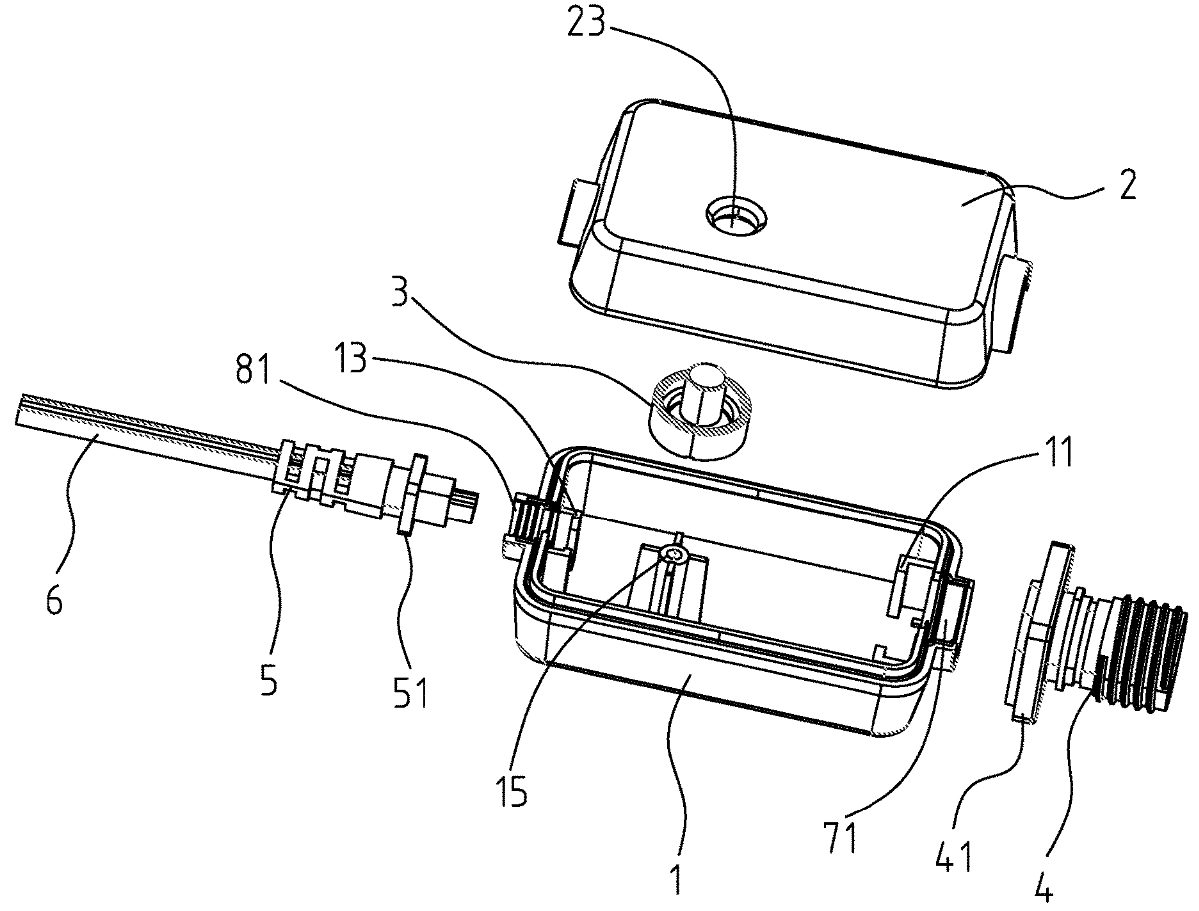
FIG. 1 is an exploded view of this patent application.
Figure 2:
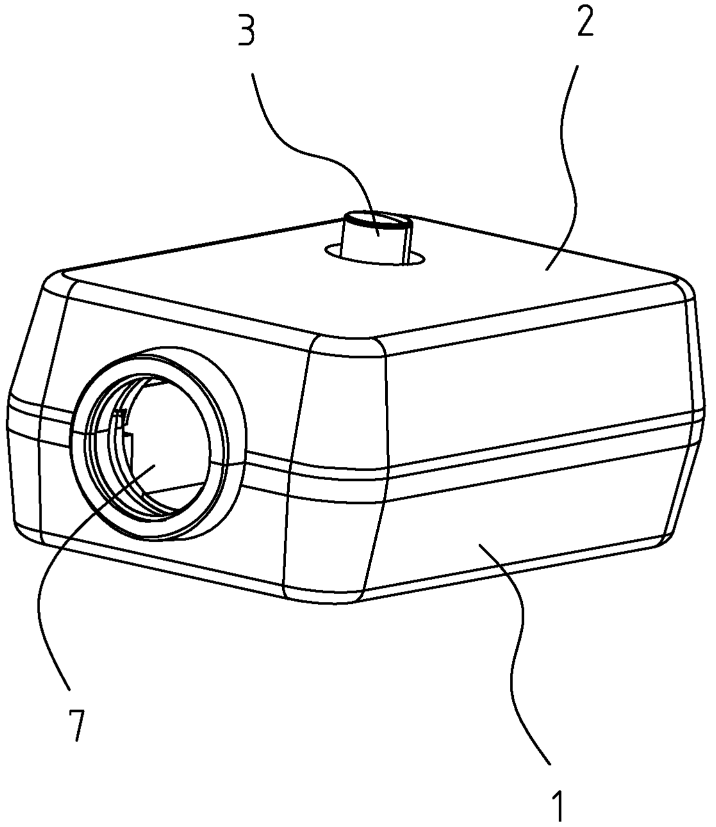
FIG. 2 is a schematic view of the front three-dimensional structure of the housing.
Figure 3:
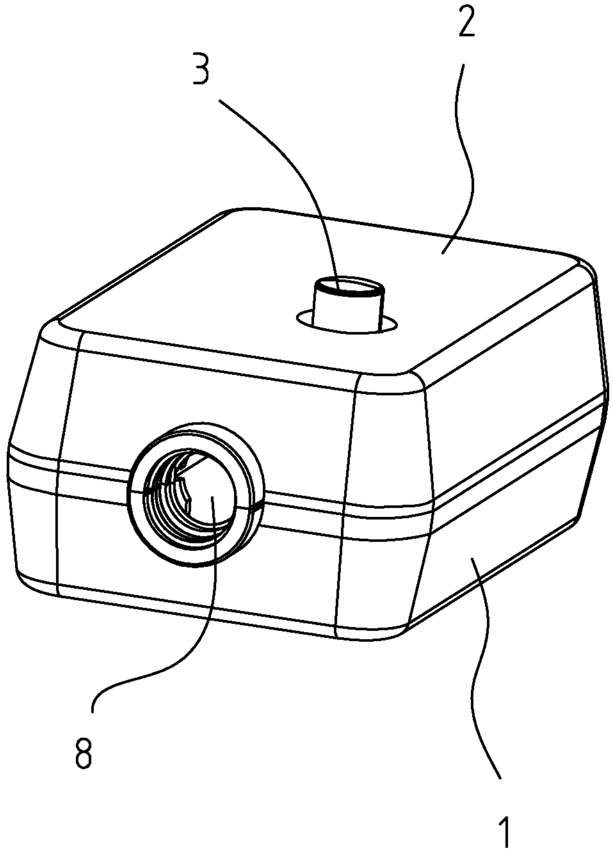
FIG. 3 is a schematic view of the back three-dimensional structure of the housing.

Label explanation: 1, first housing. 11, first connecting socket pillar. 12, first connecting socket slot. 13, first strain relief pillar. 14, first strain relief slot. 15, first support pillar. 16, locating protrusion. 2, second housing. 21, second connecting socket pillar. 22, second connecting socket slot. 23, second strain relief pillar. 24, second strain relief slot. 25, switching through-hole. 26, annular groove. 27, second support pillar. 28, stop pins. 29, locating groove. 3, rubber button. 31, button mounting part. 32, button working part. 4, connecting socket. 41, connecting socket latching part. 42, connecting socket matching part. 43, welding protrusion. 5, strain relief. 51, strain relief latching part. 52, strain relief matching part. 6, power cord. 7, first mounting through-hole. 71, first grooves. 72, first convex strip. 73, welding groove. 8, second mounting through-hole. 81, second grooves. 82, second convex strips.

DETAILED DESCRIPTION

The following further explains this patent application in conjunction with the drawings.

As shown in FIGS. 1-5, 7, and 8, a waterproof LED controller, including a housing, a power cord component on one side of the housing, and a connecting socket on the other side of the housing 4. The housing has a first mounting through-hole 7 on one side for the connecting socket 4 and a second mounting through-hole 8 on the other side for the power cord component. The connecting socket 4 has a matching part 42 that forms a tight fixed connection with the first mounting through-hole 7 after ultrasonic welding of the housing. The power cord component includes a power cord 6 and a strain relief 5, with the strain relief 5 having a matching part 52 that forms a tight fixed connection with the second mounting through-hole 8 after ultrasonic welding of the housing. The inner surface of the first mounting through-hole 7 is equipped with a first convex strip 72, and the inner surface of the second mounting through-hole 8 is equipped with two or more second convex strips 82. the first convex strip 72 and the second convex strips 82 enhance the waterproofness of the first and second mounting through-hole 7, 8.

As shown in FIGS. 1-5 and 7, the housing includes a first housing 1 and a second housing 2 fixedly connected to the first housing 1. Both sides of the first housing 1 and the second housing 2 have a first groove 71 and a second groove

81. The first groove 71 on the first housing 1 and the first groove 71 on the second housing 2 combine to form the first mounting through-hole 7. The second groove 81 on the first housing 1 and the second groove 81 on the second housing 2 combine to form the second mounting through-hole 8. The first groove 71 is equipped with a welding groove 73, and the connecting socket 4 is equipped with a welding protrusion 43 that matches the welding groove 73. The welding groove 73 and the welding protrusion 43 form a connection through ultrasonic welding.

Figure 4:
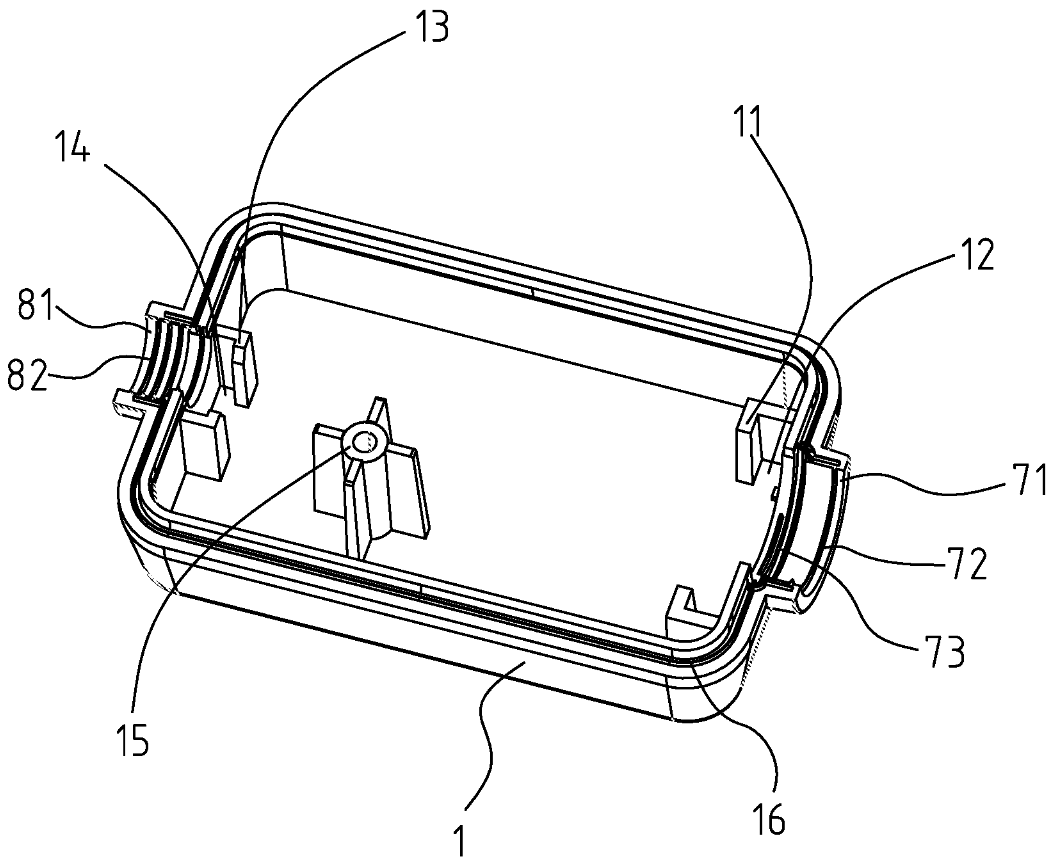
FIG. 4 is a schematic view of the three-dimensional structure of the first housing.
Figure 5:
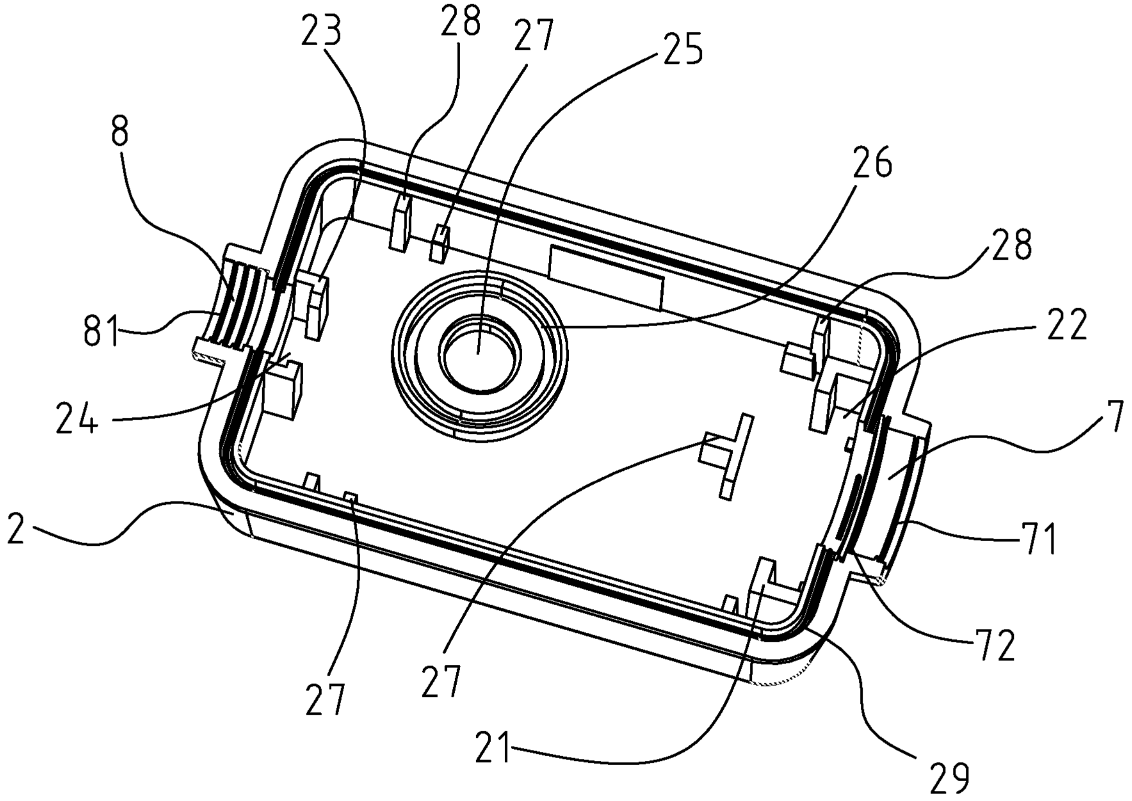
FIG. 5 is a schematic view of the three-dimensional structure of the second housing.
Figure 6:
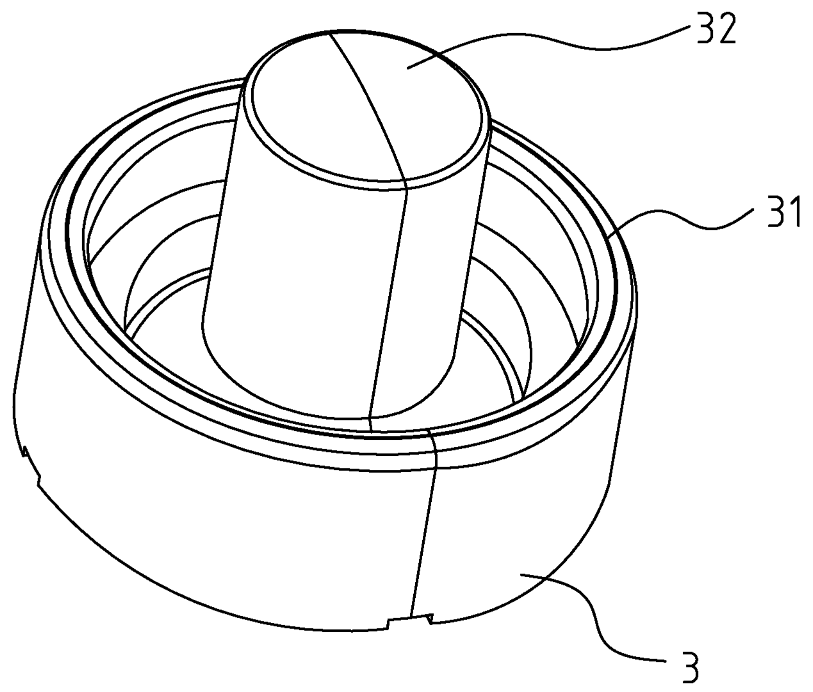
FIG. 6 is a schematic view of the three-dimensional structure of the rubber button.
Figure 7:
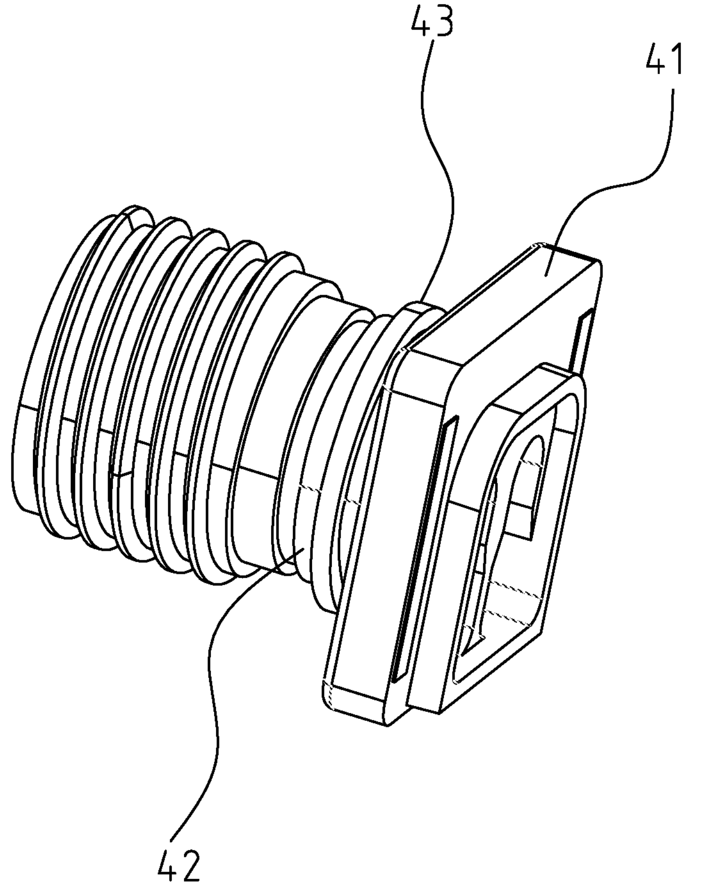
FIG. 7 is a schematic view of the three-dimensional structure of the connecting socket.
Figure 8:
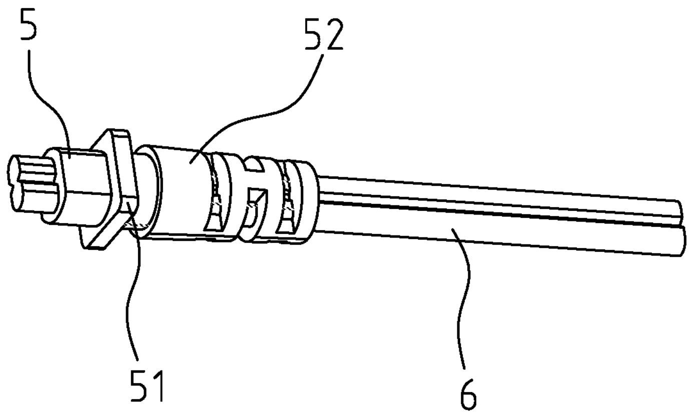
FIG. 8 is a schematic view of the three-dimensional structure of the power cord component.

As shown in FIGS. 4 and 5, the inner surface of the first housing has locating protrusions 16, and the inner surface of the second housing has locating grooves 29 matching the locating protrusions 16. The locating protrusions and grooves are connected by ultrasonic welding to fix the first and second housings together.

As shown in FIGS. 4, 5, 7, and 8, the first housing 1 internally has two first connecting socket protrusions 11 and two first strain relief pillars 13, and the second housing 2 internally has two second connecting socket protrusions 21 and two second strain relief pillars 23 corresponding to the first connecting socket pillars 11 and the first strain relief pillars 13, respectively. the two first connecting socket pillars 11 form the first connecting socket slot 12, and the two second connecting socket pillars 21 form the second connecting socket slot 22 corresponding to the first connecting socket slot 12. The two first strain relief pillars 13 form the first strain relief slot 14, and the two second strain relief pillars 23 form the second strain relief slot 24 corresponding to the first strain relief slot 14. The connecting socket 4 is equipped with a connecting socket latching part 41, which, after ultrasonic welding of the housing, is inserted into the first connecting socket slot 12 and the second connecting socket slot 22 to complete a tight fixed connection. The strain relief 5 is equipped with a strain relief latching part 51, which, after ultrasonic welding of the housing, is inserted into the first strain relief slot 14 and the second strain relief slot 24 to complete a tight fixed connection, making the connection of the connecting socket 4 and the power cord component with the housing more robust.

As shown in FIGS. 4 and 5, a first support pillar 15 for supporting the circuit board is provided on the inner surface of the first housing 1, and a second support pillar 27 for supporting the circuit board is provided inside the second housing 2. The first support pillar 15 and the second support pillar 27 work together to prevent longitudinal movement of the circuit board. The second housing 2 internally has four stop pins 28, which work together to prevent lateral movement of the circuit board.

As shown in FIGS. 1, 4, 5, and 6, the inner surface of the second housing 2 has an annular groove 26 with a switching through-hole 25 in the middle, and a rubber button 3 is placed on the annular groove 26. The rubber button 3 includes a cylindrical button working part 32 in the middle and a button mounting part 33 around the perimeter. The cylindrical button passes through the switching through-hole 25, and the button mounting part 31 is an annular protrusion embedded in the annular groove 26. By pressing the button working part 32, the controller is turned on and off. After the button mounting part 31 is embedded in the annular groove 26, the height of the second support pillar 27 is lower than the height of the button mounting part 31. This keeps the first support pillar 15 always pressing against the circuit board, thereby keeping the circuit board always pressing against the rubber button 3, preventing the rubber button 3 from becoming loose and preventing water from infiltrating through the switching through-hole 25.

The waterproof principle of this patent application is that waterproofness at the tight junction of the connecting socket and the first mounting through-hole 7 is enhanced by a first convex strip 71 on the first mounting through-hole 7, and waterproofness at the tight junction of the strain relief 5 and the second mounting through-hole 8 is enhanced by second convex strips 82 on the second mounting through-hole 8. The locating protrusion 16 on the first housing 1 and the locating groove 29 on the second housing 2 are ultrasonically welded. A welding groove 73 matching the welding protrusion 43 on the connecting socket 4 is set on the inner surface of the first mounting through-hole, allowing the welding protrusion 43 and welding groove 73 to be ultrasonically welded. The circuit board is supported against the rubber button 3 by the first support pillar 15, preventing water infiltration through the switching through-hole 25 and forming a sealed structure to achieve the overall waterproofing.

The invention claimed is:

1. A waterproof LED controller, comprising a housing, a power cord component on one side of the housing, and a connecting socket on the other side of the housing, wherein:

the housing includes a first housing and a second housing fixedly connected to the first housing; the inner surface of the first housing is equipped with a locating protrusion, and the inner surface of the second housing is equipped with a locating groove that matches the first protrusion; the locating protrusion and the locating groove are fixedly connected to the first and second housings through ultrasonic welding;

one side of the housing is equipped with a first mounting through-hole for installing the connecting socket, and the other side of the housing is equipped with a second mounting through-hole for installing the power cord assembly; the inner surfaces of both the first and the second mounting through-holes are equipped with convex strip;

the connecting socket is equipped with a connecting socket matching part, which is tightly and fixedly connected to the first mounting through-hole; the power cord assembly includes a power cord and a strain relief, the strain relief is equipped with a strain relief matching part, which is tightly and fixedly connected to the second mounting through-hole;

the first mounting through-hole is equipped with a welding groove, and the connecting socket is equipped with a welding protrusion that matches the welding groove; the welding protrusion is fixedly connected to the welding groove through ultrasonic welding;

both sides of the first housing and the second housing are equipped with a first groove and a second groove, the first groove on the first housing and the first groove on the second housing combine to form the first mounting through-hole, the second groove on the first housing and the second groove on the second housing combine to form the second mounting through-hole.

2. The waterproof LED controller according to claim 1, wherein: the inner surface of the second housing is equipped with an annular groove, there is a switching through-hole in the middle of the annular groove, and a rubber button is placed on the annular groove.

3. The waterproof LED controller according to claim 2, wherein: the rubber button includes a button working part located in the middle of the rubber button and a button mounting part located on the periphery of the rubber button;

the button working part is a cylindrical button, which passes through the switching through-hole;

the button mounting part is an annular protrusion, which is embedded in the annular groove.

4. The waterproof LED controller according to claim 3, wherein: the inner surface of the first housing is equipped with a first support pillar that supports the circuit board, and the second housing is equipped with a second support pillar that supports the circuit board;

the height of the second support pillar is lower than the height of the button mounting part embedded in the annular groove.

5. The waterproof LED controller according to claim 1, wherein: the inner surface of the first housing is equipped with a first connecting socket latching slot and a first strain relief latching slot, the inner surface of the second housing is equipped with a second connecting socket latching slot and a second strain relief latching slot.

6. The waterproof LED controller according to claim 5, wherein: the inner surface of the first housing is equipped with two first connecting socket convex strips, which form the first connecting socket latching slot;

the inner surface of the second housing is equipped with two second connecting socket convex strips, which form the second connecting socket latching slot;

the inner surface of the first housing is equipped with two first strain relief convex strips, which form the first strain relief latching slot;

the inner surface of the second housing is equipped with two second strain relief convex strips, which form the second strain relief latching slot.

7. The waterproof LED controller according to claim 6, wherein: the connecting socket is equipped with a connecting socket latching part, which is inserted into the first and second connecting socket latching slots;

the strain relief is equipped with a strain relief latching part, which is inserted into the first and second strain relief latching slots.

8. The waterproof LED controller according to claim 1, wherein: the second housing is equipped with a stop pin that restricts the lateral movement of the circuit board.

* * * * *